(12) United States Patent
Rajski et al.

(10) Patent No.: US 12,596,150 B2
(45) Date of Patent: Apr. 7, 2026

(54) X-MASKING FOR IN-SYSTEM DETERMINISTIC TEST

(71) Applicant: Siemens Industry Software Inc., Plano, TX (US)

(72) Inventors: Janusz Rajski, West Linn, OR (US); Grzegorz Mrugalski, Swarzedz (PL); Jerzy Tyszer, Poznan (PL); Bartosz Wlodarczak, Swarzedz (PL)

(73) Assignee: Siemens Industry Software Inc., Plano, TX (US)

( * ) Notice: Subject to any disclaimer, the term of this patent is extended or adjusted under 35 U.S.C. 154(b) by 32 days.

(21) Appl. No.: 18/713,259

(22) PCT Filed: Dec. 7, 2021

(86) PCT No.: PCT/US2021/062093

§ 371 (c)(1),
(2) Date: May 24, 2024

(87) PCT Pub. No.: WO2023/107096

PCT Pub. Date: Jun. 15, 2023

(65) Prior Publication Data

US 2024/0337693 A1 Oct. 10, 2024

(51) Int. Cl.
G01R 31/3185 (2006.01)

(52) U.S. Cl.
CPC ............... G01R 31/318547 (2013.01); G01R 31/318563 (2013.01)

(58) Field of Classification Search
CPC ............... G01R 31/318547; G01R 31/318563
See application file for complete search history.

(56) References Cited

U.S. PATENT DOCUMENTS 6,829,740 B2 * 12/2004 Rajski ........... G01R 31/318547
714/729
7,925,947 B1 4/2011 Touba et al.
(Continued)

FOREIGN PATENT DOCUMENTS

WO WO 2021/045769 3/2021

OTHER PUBLICATIONS

A. Kumar, M. Kassab, E. Moghaddam, N. Mukherjee, J. Rajski, S.M. Reddy, J. Tyszer and C. Wang, "Isometric test compression with Low Toggling activity", IEEE International Test Conference, 2014.

(Continued)

*Primary Examiner* — Guerrier Merant
*Assistant Examiner* — Jack Kensington Barnett

(57) ABSTRACT

A circuit comprises: scan chains comprising scan cells, the scan chains configured to shift in test patterns, apply the test patterns to the circuit, capture test responses of the circuit, and shift out the test responses; a decompressor configured to decompress compressed test patterns into the test patterns; and a test response compactor configured to compact the test responses, the test response compactor comprising: first X-masking circuitry configured to mask, based on first masking information, some of X bits in the test responses, the first masking information remaining the same while a test response for each of the test patterns is being shifted out, the first masking information being different for at least two of the test patterns; and second masking circuitry configured to mask, based on second masking information, rest of the X bits in the test responses.

14 Claims, 10 Drawing Sheets

Scan test system 900

(56)                  References Cited

U.S. PATENT DOCUMENTS

| | | | |
|---|---|---|---|
| 8,468,404 | B1 | 6/2013 | Chickermane et al. |
| 9,404,969 | B1 | 8/2016 | Keller et al. |
| 2006/0236186 | A1 | 10/2006 | Wang et al. |
| 2007/0234157 | A1* | 10/2007 | Rajski ............ G01R 31/318566 |
| | | | 714/728 |
| 2011/0307750 | A1* | 12/2011 | Narayanan ..... G01R 31/318547 |
| | | | 714/E11.055 |
| 2022/0308110 | A1* | 9/2022 | Liu .................... G01R 31/3177 |

OTHER PUBLICATIONS

Rajski, et al: "X-Press: Two-Stage X-Tolerant Compactor With Programmable Selector"; Jan. 2008; IEEE; vol. 27; No. 1; pp. 147-159.

J. Rajski, J. Tyszer, G. Mrugalski, N. Mukherjee, W.T. Cheng, M. Kassab, M. Sharma and L. Lai "X-tolerant compactor with on-chip registration and signature-based diagnosis," IEEE Design and Test of Computers, vol. 24, pp. 476-485, Sep.-Oct. 2007.

G. Mrugalski, J. Rajski, and J. Tyszer G., "Test response compactor with programmable selector," in Proc. DAC, pp. 1089-1094, Sep. 2006.

Y. Liu, S. Milewski, G. Mrugalski, N. Mukherjee, J. Rajski, J. Tyszer and B. Wlodarczak, "X-tolerant tunable compactor for in-system test," IEEE International Test Conference, 2020.

* cited by examiner

Gating circuitry 420

Linear mapping circuitry 430

First X-masking circuitry 400

Scan chains 410

Mask register 440

Compressed mask bits (first masking information) 445

Multiple input
signature register
500

X-MASKING FOR IN-SYSTEM DETERMINISTIC TEST

FIELD OF THE DISCLOSED TECHNIQUES

The presently disclosed techniques relates to circuit testing. Various implementations of the disclosed techniques may be particularly useful for filtering out unknown states that may degrade test results.

BACKGROUND OF THE DISCLOSED TECHNIQUES

Test data compression is widely recognized as instrumental in reducing the overall cost of scan-based semiconductor device testing. With aggressive technology scaling, test response compaction, working synergistically with test stimuli compression, plays a key role in handling test data volume growth. In a conventional manufacturing test compression environment, a sequential decompressor receives test stimuli data from a tester through a few input channels. On the output side, XOR trees operating as spatial compactors for scan chain bundles produce compressed test response data before the circuit transports it back to the tester.

Compression-based test schemes also become a safety mechanism that is periodically applied during a device's run-time to detect faults in safety-critical applications. A reliable test response compactor can preserve observability of as many scan cells as possible despite the presence of unknown states (Xs). X states occur in circuit designs due to non-scan flip-flops, uninitialized memory elements, floating buses, bus contentions, internal three-state logic, unwrapped analog modules, false paths, cross-domain paths, or paths with timing closure problems. X states can lead to unknown bits (X bits) in test responses, severely deteriorating test quality. Typically, a test response compactor employs a mechanism for masking X bits, which is referred to as X-masking.

Not all X bits captured in scan cells are subsequently masked for manufacturing tests. Designers often try to achieve a tradeoff between on-chip test logic complexity, a collateral damage caused by inadvertent masking of non-X bits, the resultant test coverage and test time, as well as test data needed to control X-masking. On the other hand, an in-system test set-up needs to control scan selection with a minimal amount of data without compromising the high test quality. Thus, preventing all X bits from reaching a test response compactor is often needed for safety critical devices which must test themselves during system operations. This is especially true for compactors comprising multiple-input signature registers (MISR) whose feedback allows X bits to quickly proliferate and render the whole test useless.

BRIEF SUMMARY OF THE DISCLOSED TECHNIQUES

Various aspects of the disclosed technology relate to filtering out unknown states in test responses. In one aspect, there is a circuit, comprising: scan chains comprising scan cells, the scan chains configured to shift in test patterns, apply the test patterns to the circuit, capture test responses of the circuit, and shift out the test responses; a decompressor configured to decompress compressed test patterns into the test patterns; and a test response compactor configured to compact the test responses, the test response compactor comprising: first X-masking circuitry configured to mask, based on first masking information, some of X bits in the test responses, the first masking information remaining the same while a test response for each of the test patterns is being shifted out, the first masking information being different for at least two of the test patterns; and second X-masking circuitry configured to mask, based on second masking information, rest of the X bits in the test responses.

The first X-masking circuitry may operate in a per test pattern mode and the second X-masking circuitry may operate in a per clock cycle mode.

The first X-masking circuitry may be configured to block outputs from some of the scan chains based on the first masking information. The test response compactor may further comprise: spatial test response compacting circuitry with inputs coupled to outputs of the first X-masking circuitry.

The test response compactor may further comprise: a multiple input signature register with inputs coupled to outputs of the second X-masking circuitry or sticky-bits circuitry with inputs coupled to outputs of the second X-masking circuitry.

The second X-masking circuitry may comprise: decompressing circuitry configured to generate a gating control signal from a compressed mask signal, the decompressing circuitry comprising a hold register configured to keep outputs of the decompressing circuitry from changing for some clock cycles based on a hold signal; and gating circuitry configured to gate signals at inputs of the gating circuitry based on the outputs of the decompressing circuitry. The second X-masking circuitry may further comprise: an enable register configured to store enable data; and another gating circuitry configured to generate an enabled gating control signal by gating the gating control signal based on the enable data, wherein the gating circuitry configured to gate signals at inputs of the gating circuitry based on the enabled gating control signal. The decompressing circuitry may further comprise a decompressing unit, the decompressing unit being a standalone device or a part of the decompressor.

The second X-masking circuitry may comprise: decompressing circuitry configured to generate a gating control signal from a compressed signal; an enable register configured to store enable data; first gating circuitry configured to gate the gating control signal based on the enable data to generate an enabled gating control signal; and second gating circuitry configured to gate signals at inputs of the second gating circuitry based on the enabled gating control signal. The decompressing circuitry may comprise a hold register configured to keep outputs of the decompressing circuitry from changing for some clock cycles based on a hold signal. The decompressing circuitry may comprise a decompressing unit, the decompressing unit being a standalone device or a part of the decompressor.

In another aspect, there are one or more non-transitory computer-readable media storing computer-executable instructions for causing one or more processors to perform a method, the method comprising: creating a circuit in a circuit design for testing a chip fabricated according to the circuit design, the circuit comprising: scan chains comprising scan cells, the scan chains configured to shift in test patterns, apply the test patterns to the circuit, capture test responses of the circuit, and shift out the test responses; a decompressor configured to decompress compressed test patterns into the test patterns; and a test response compactor configured to compact the test responses, the test response compactor comprising: first X-masking circuitry configured to mask, based on first masking information, some of X bits in the test responses, the first masking information remaining the same while a test response for each of the test patterns is being shifted out, the first masking information being different for at least two of the test patterns; and second X-masking circuitry configured to mask, based on second masking information, rest of the X bits in the test responses.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to filtering out unknown states in test responses. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "compact," "decompress," and "mask" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
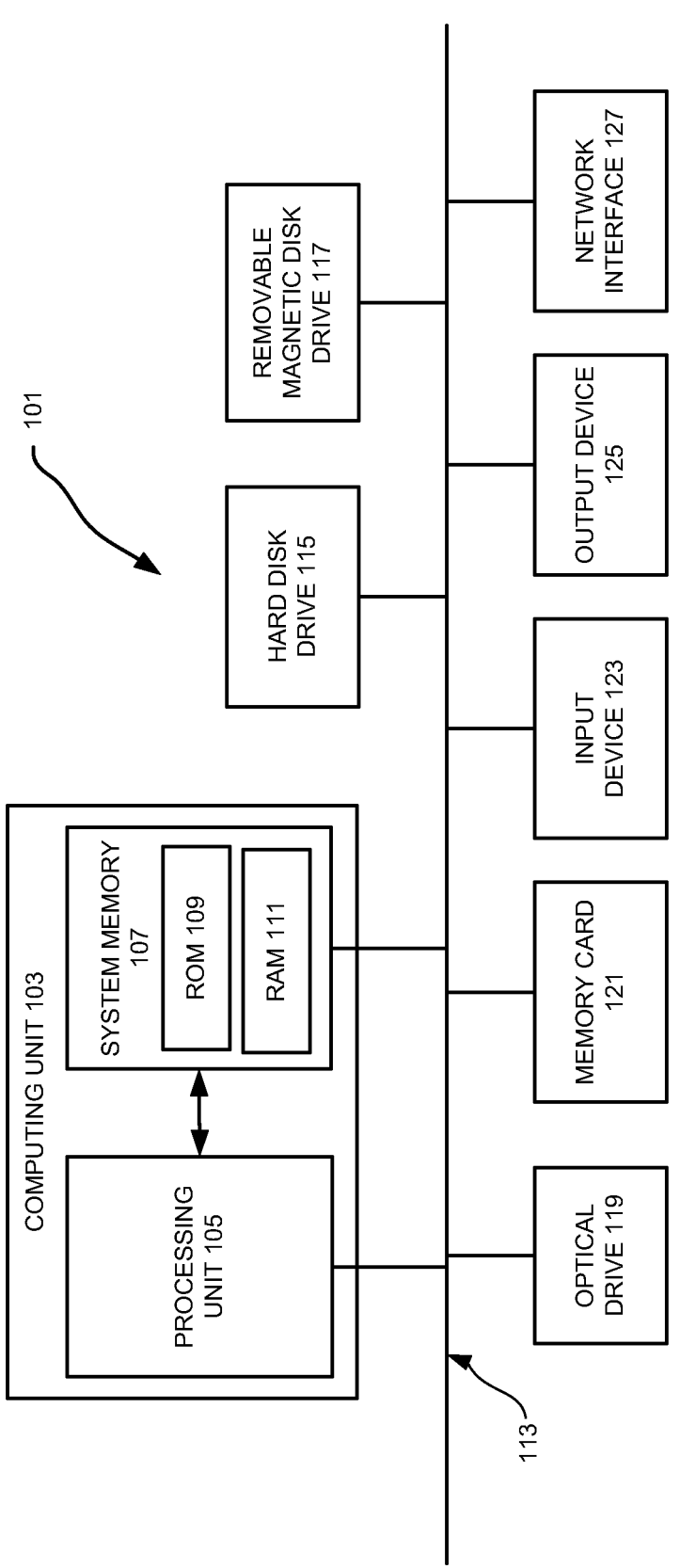
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the network interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it is not intended to be limiting. Various embodiments of the disclosed technology may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design for Test, Test Pattern Generation, and Testing

The reduction in feature size increases the probability that a manufacture defect in an integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan testing (scan mode). A widely used type of scan cell includes an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

A popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis) and chain diagnosis. Logic diagnosis may employ a fault dictionary or directly examine the syndrome (i.e., the effect) of the failing chip to determine likely defect locations (defect suspects). The latter approach may include structural pruning (back tracing), fault injection and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the quality of diagnosis, a diagnostic test pattern generation process may be employed. This process generates test patterns that can refine the set of defect suspects.

Chain diagnosis determines scan cells that are likely to be defective. Scan elements and related clocking circuitry can take up about 30% of silicon area of an IC chip. It has been reported that scan chain failures account for almost 50% of chip failure in some cases. Chain diagnosis is thus important to guide physical failure analysis and yield learning process. In a chain diagnosis process, two types of test patterns may be used. The first type is called chain patterns. A chain pattern is a pattern used in a process comprising shift-in and shift-out without pulsing capture clocks. The other type is often referred to as scan patterns. A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells. Some techniques for chain diagnosis are disclosed in U.S. Pat. Nos. 7,788,561; 8,615,695; 8,316,265; 8,689,070; 8,843,796; and 9,086,459, of which all are hereby incorporated herein by reference.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudorandom pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Siemens Industry Software, Inc., Plano, Texas.

Two-Level X-Masking

Figure 2:
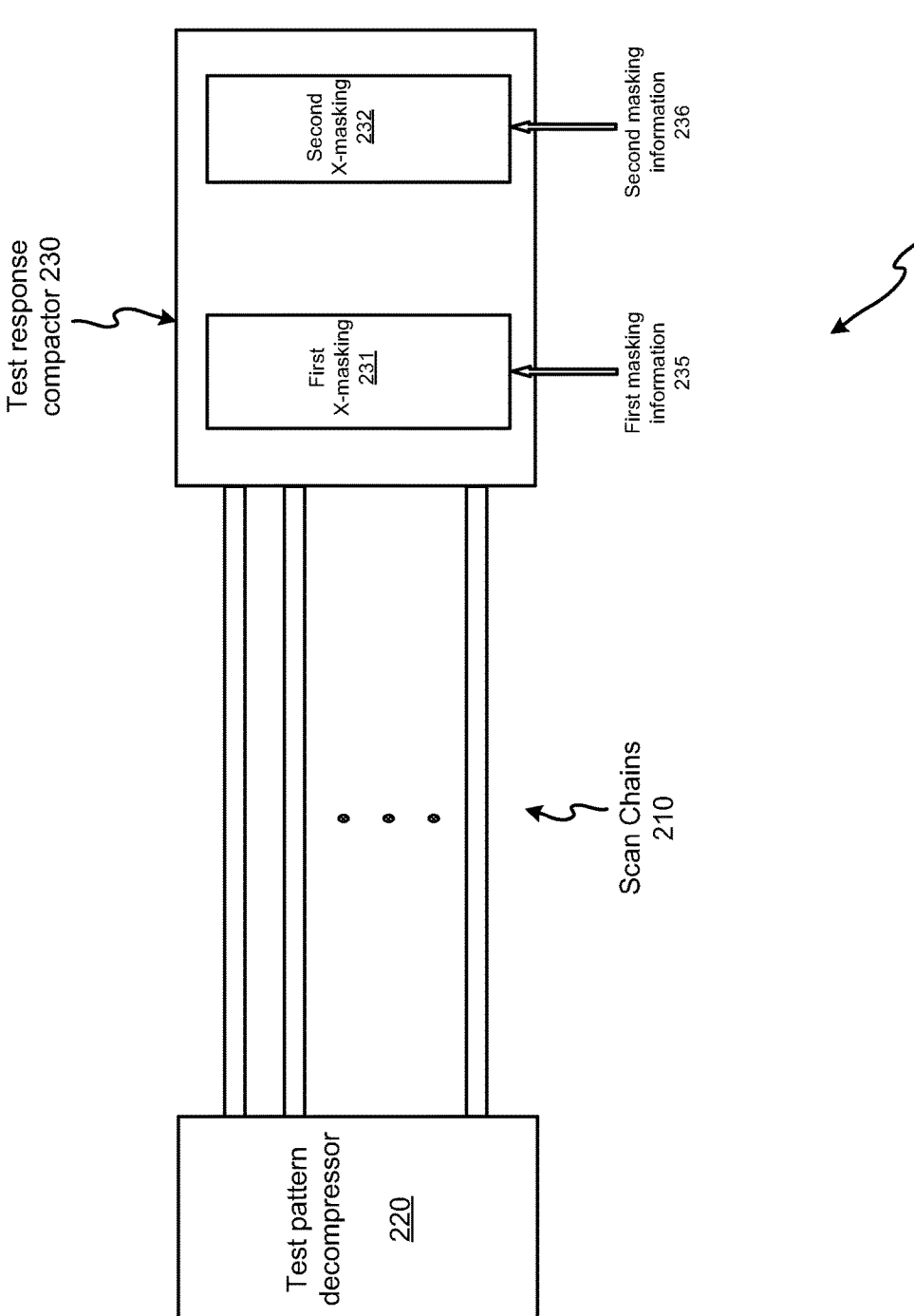
FIG. 2 illustrates an example of a scan test system according to various embodiments of the disclosed technology.

FIG. 2 illustrates an example of a scan test system 200 according to various embodiments of the disclosed technology. The scan test system 200 comprises scan chains 210, a test pattern decompressor 220, and a test response compactor 230. The scan chains 210, comprising scan cells, are configured in a test mode to shift in test patterns, apply the test patterns to the circuit, capture test responses of the circuit, and shift out the test responses. The test pattern decompressor 220 is configured to decompress compressed test patterns into the test patterns. In a typical EDT compression architecture, the test pattern decompressor 220 comprises a ring generator and a phase shifter. The test response compactor 230 is configured to compact the test responses. The test response compactor 230 can comprise temporal test response compacting circuitry such as a multiple-input signature register (MISR), spatial test response compacting circuitry such as one or more XOR gate networks, or a combination of the two. In FIG. 2, the test response compactor 230 is shown to further comprise first X-masking circuitry 231 and second X-masking circuitry 232. The first X-masking circuitry 231 is configured to mask, based on first masking information 235, some of X bits in the test responses. The first masking information 235 remains the same while a test response for each of the test patterns is being shifted out, but is different for at least two of the test patterns. In one embodiment of the disclosed technology, the first masking information 235 may change with test pattern, enabling the first X-masking circuitry 231 to operate in a per test pattern mode. For example, the first X-masking circuitry 231 can block outputs from different groups of scan chains for different test patterns. Which scan chains to be blocked can be based on the locations of X bits. The second X-masking circuitry 232 is configured to mask, based on second masking information 236, the rest of the X bits in the test responses (e.g. the remaining X bits in the test responses not masked by the first X-masking circuitry 231). The second masking information 236 may change with clock cycle, enabling the second X-masking circuitry 232 to operate in a per clock cycle mode.

Figure 3:
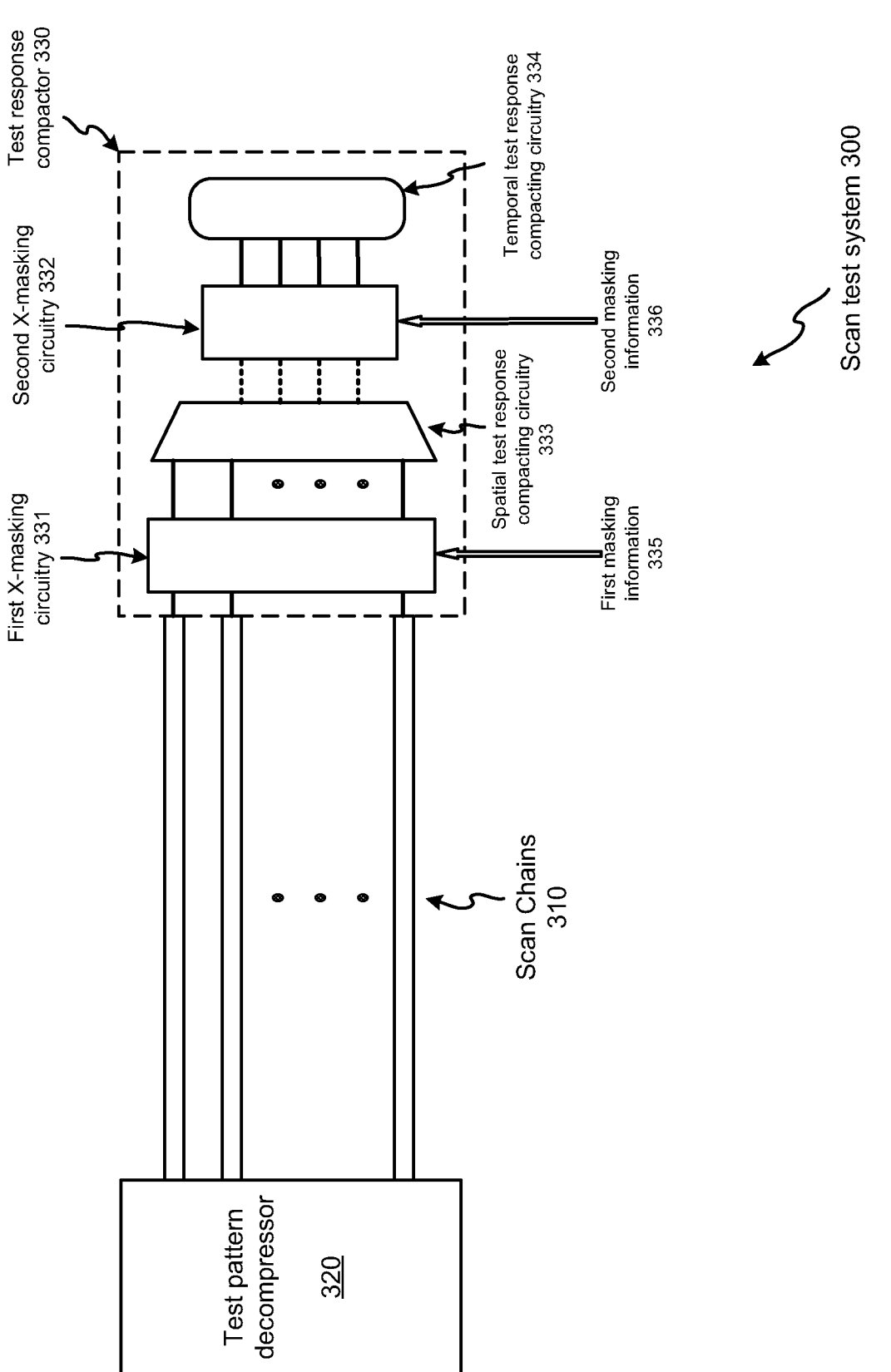
FIG. 3 illustrates another example of a scan test system according to various embodiments of the disclosed technology.

FIG. 3 illustrates an example of a scan test system 300 according to various embodiments of the disclosed technology. Like the scan test system 200 in FIG. 2, the scan test system 300 comprises scan chains 310, a test pattern decompressor 320, and a test response compactor 330. The test response compactor 330 is shown to comprise first X-masking circuitry 331 and second X-masking circuitry 332 as well. Unlike the test response compactor 230 in FIG. 2, however, the test response compactor 330 is shown to further comprise spatial test response compacting circuitry 333 and temporal test response compacting circuitry 334. In FIG. 3, inputs of the first X-masking circuitry 331 are connected to outputs of the scan chains 310 while outputs of the first X-masking circuitry 331 are connected to inputs of the spatial test response compacting circuitry 333, and outputs of the second X-masking circuitry 332 are connected to inputs of the temporal test response compacting circuitry 334. Outputs of the spatial test response compacting circuitry 333 and inputs of the second X-masking circuitry 332 may be connected directly or indirectly, as indicated by dot lines.

As an example of the indirect connection, the scan test system 300 may further comprise a comparator inserted between the outputs of the spatial test response compacting circuitry 333 and the inputs of the second X-masking circuitry 332. The comparator can be configured to compare the outputs of the spatial test response compacting circuitry 333 with good machine values. The comparison results are coupled to the inputs of the second X-masking circuitry 332.

The first X-masking circuitry 331 can mask, based on first masking information 335, some of the X bits in test responses before the test responses are compacted by the spatial test response compacting circuitry 333. The second X-masking circuitry 332 can mask, based on second masking information 336, the remaining X bits in the test responses before the temporal test response compacting circuitry 334 performs a further compaction.

Figure 4:
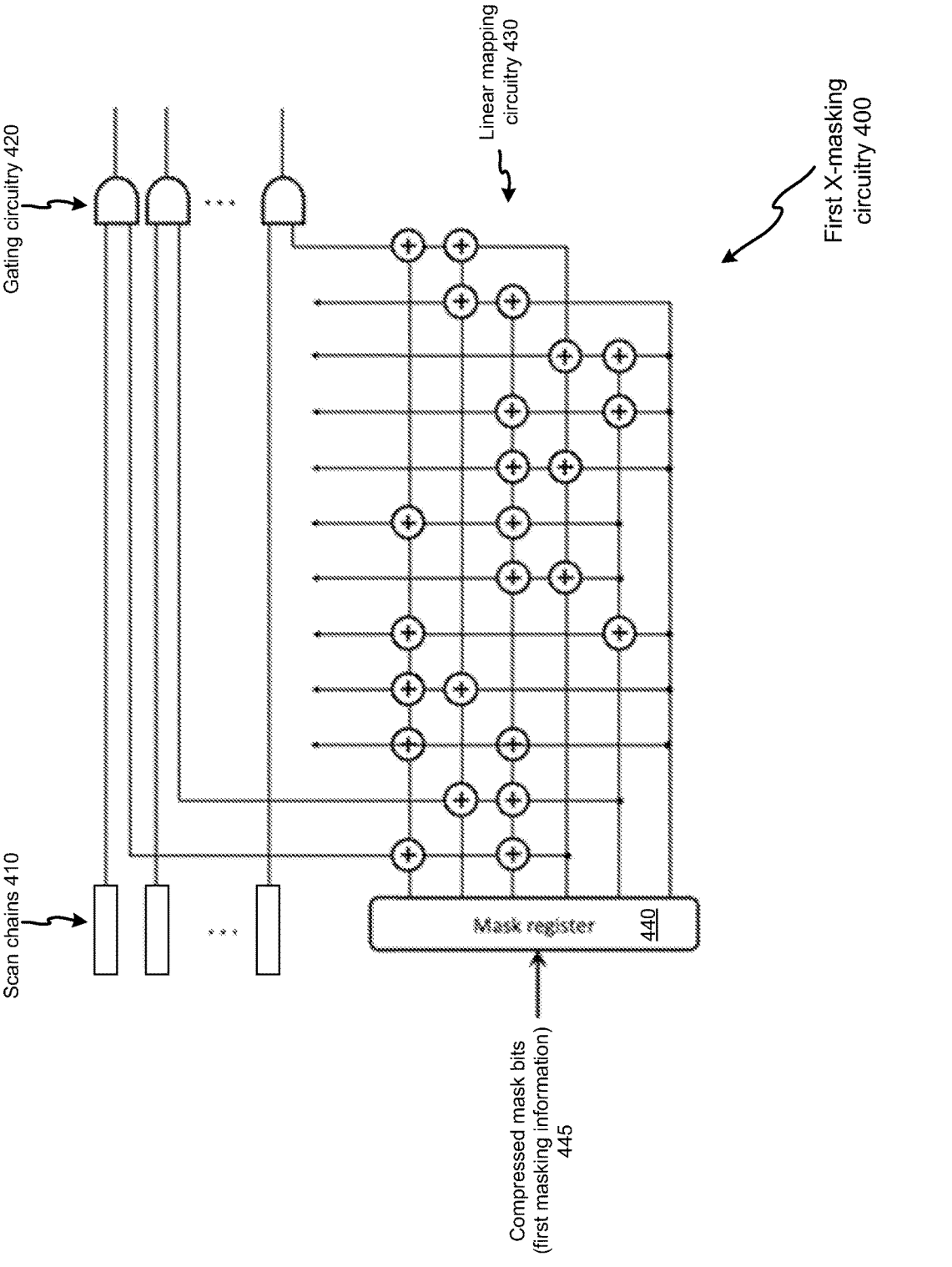
FIG. 4 illustrates an example of first X-masking circuitry which can be used to implement the first X-masking circuitry in FIGS. 2 and 3 according to various embodiments of the disclosed technology.

FIG. 4 illustrates an example of first X-masking circuitry 400 which can be used to implement the first X-masking circuitry 231 in FIG. 2 and the first X-masking circuitry 331 in FIG. 3 according to various embodiments of the disclosed technology. The first X-masking circuitry 400 comprises a mask register 440, linear mapping circuitry 430, and gating circuitry 420. The mask register 440 is configured to store compressed mask bits 445 (the first masking information 235 in FIG. 2, the first masking information 335 in FIG. 3). The linear mapping circuitry 430 comprises XOR gates and can decompress the compressed mask bits 445 into mask bits. The gating circuitry 420 comprises AND gates and can mask outputs of some of scan chains 410 based on the mask bits. The mask register 440 may update its content per test pattern. As such, the first X-masking circuitry 400 can operate in a per test pattern mode.

To guarantee that scan chains are enabled or disabled in accordance with the pre-specified requirements, the linear mapping circuitry 430 can be defined in terms of selector polynomials indicating how mask bits are connected to the outputs. Synthesis of this selection logic can be primarily aimed at achieving high encoding efficiency defined as a ratio of successfully encoded gating signals to the number of mask bits. Since encoding efficiency is directly related to the probability of linear dependency among selector polynomials, the task of designing selector can be guided by data indicating how likely it is that some of the already accepted polynomials and those regarded as possible candidates may form linearly dependent sets.

In the per test pattern mode, X bits may hinder observability of certain errors in a twofold manner. If a given X bit is not suppressed, then it is impossible to observe errors captured at the same scan out cycle and arriving from scan chains it is compacted with. On the other hand, blocking an X bit hides all errors occurring in the same scan chain. Therefore, given locations of failing scan cells and unknown states for each test pattern, finding the complete set of masking bits can be performed using a scan chain ranking algorithm, which may be found in Grzegorz Mlrugalski et al., "Test response compactor with programmable selector," in Proc. DAC, 2006, pp. 1089-1094.

Figure 5:
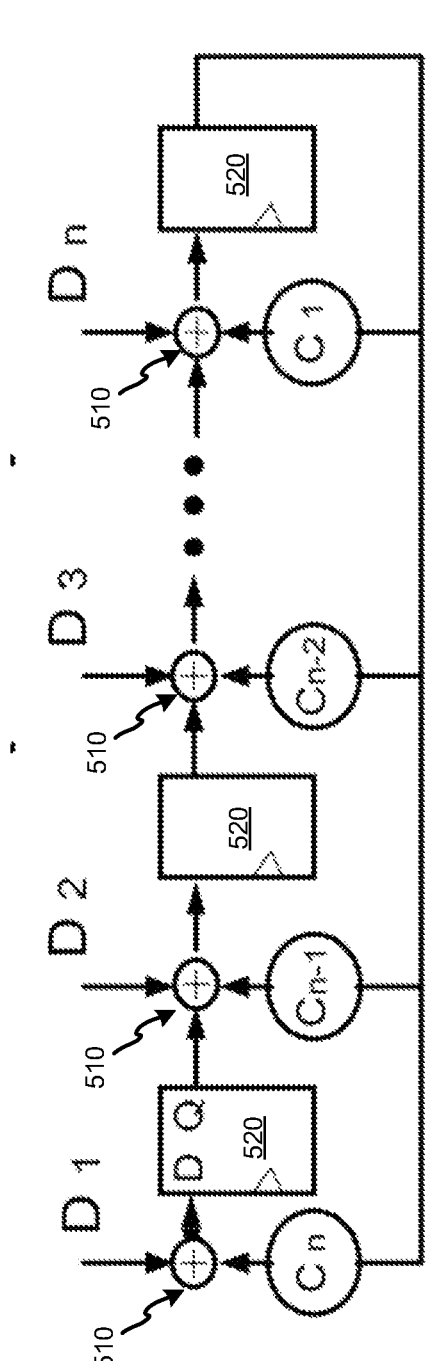
FIG. 5 illustrates an example of a multiple-input signature register which can be used to implement the temporal test response compacting circuitry in FIG. 3 according to various embodiments of the disclosed technology.
Figure 5:
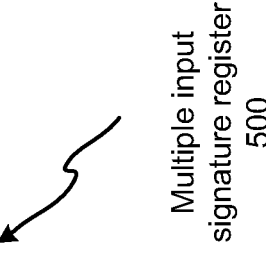

FIG. 5 illustrates an example of a multiple-input signature register 500 which can be used to implement the temporal test response compacting circuitry 334 in FIG. 3 according to various embodiments of the disclosed technology. The multiple-input signature register 500 is a feedback shift register with an n-bit input formed by flip-flops 510 and XOR gates 520. The multiple-input signature register 500 can combine bits of the test response for one test pattern into a signature. While reducing the number of output channels needed, only one X bit at a particular clock cycle, if not being masked, can render the whole test useless.

Figure 6:
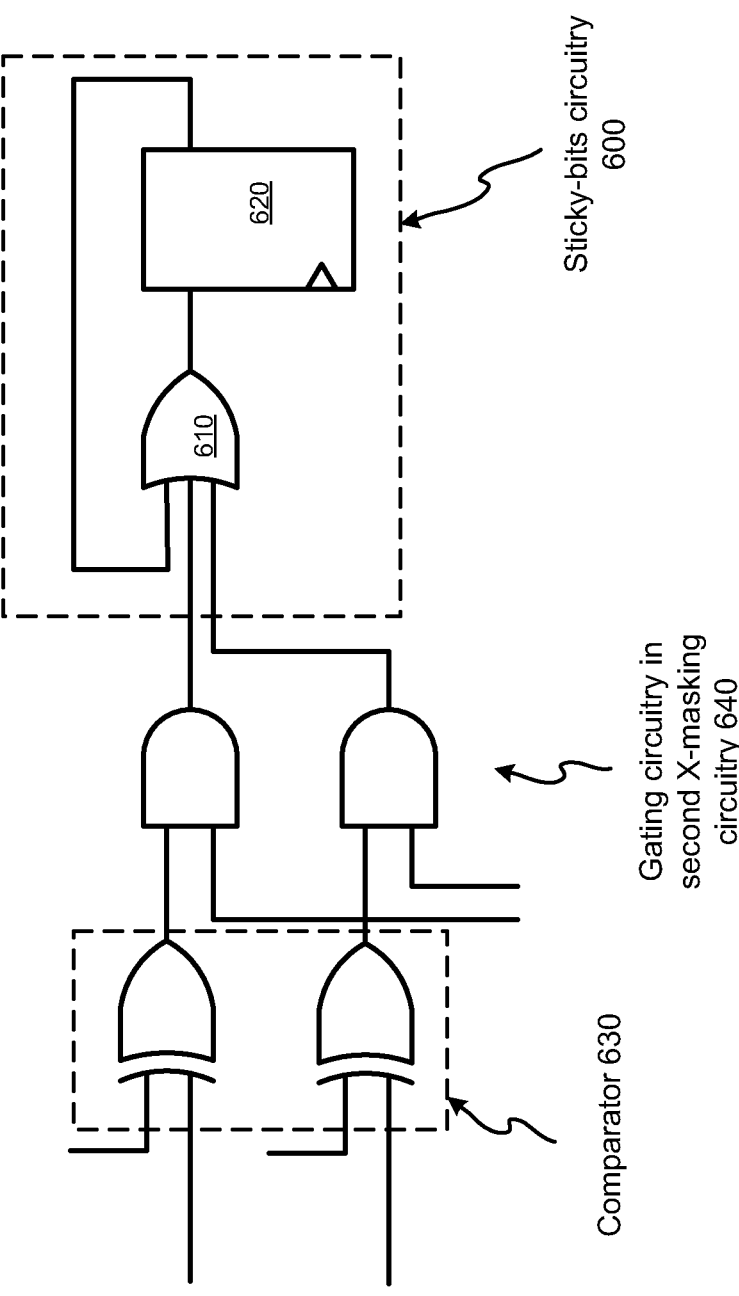
FIG. 6 illustrates an example of sticky-bits circuitry which can be used to implement the temporal test response compacting circuitry in FIG. 3 according to various embodiments of the disclosed technology.

FIG. 6 illustrates an example of sticky-bits circuitry 600 which can be used to implement the temporal test response compacting circuitry 334 in FIG. 3 according to various embodiments of the disclosed technology. The sticky-bits circuitry 600 comprises an OR gate 610 and a flip-flop 620. The output of the OR gate 610 is connected to the input of the flip-flop 620, and the output of the flip-flop 620 is fed back to one of the inputs of the OR gate 610. Whenever a bit of "1" is present at one of the inputs of the OR gate 610, the bit stored in the flip-flop 620 will change to and remain at "1". To use the sticky-bits circuitry 600, a comparator 630 is typically employed to compare test response bits with good-machine test response bits. The comparator 630 is formed with XOR gates. Thus, when a test response bit agrees with the corresponding good-machine test response bit, the resultant bit is "0". Otherwise, the resultant bit is "1". The comparison result bits pass through gating circuitry 640 in the second X-masking circuitry. The bits in the comparison result bits that are contaminated by X-bits are masked while the rest of the comparison result bits can reach the sticky-bits circuitry 600. Thus, the bit stored in the sticky-bits circuitry 600 after a test can indicate whether the circuit fails the test or not. While FIG. 6 shows two test response channels (having two XOR gate in the comparator 630 and two AND gates in the gating circuitry 640), a person of ordinary skill in the art would appreciate that the circuit can be modified to have one or more than two test response channels.

Figure 7:
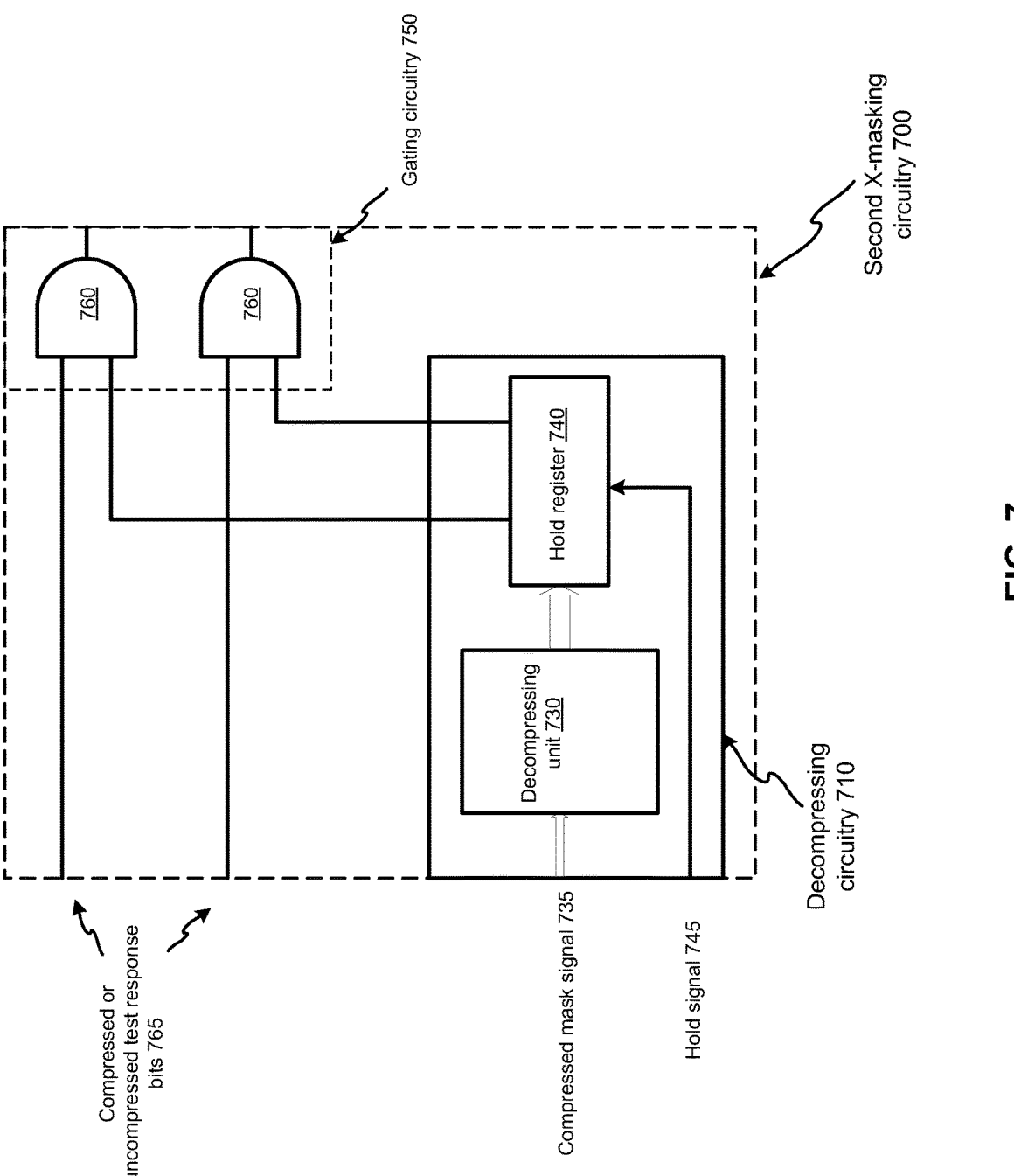
FIG. 7 illustrates an example of second X-masking circuitry which can be used to implement the second X-masking circuitry in FIGS. 2 and 3 according to various embodiments of the disclosed technology.

FIG. 7 illustrates an example of second X-masking circuitry 700 which can be used to implement the second X-masking circuitry 232 in FIG. 2 and the second X-masking circuitry 332 in FIG. 3 according to various embodiments of the disclosed technology. The second X-masking circuitry 700 comprises decompressing circuitry 710 and gating circuitry 750. The decompressing circuitry 710 is configured to generate a gating control signal for the gating circuitry 750 from a compressed mask signal 735 (second masking information). The compressed mask signal 735 is different from the compressed mask bits 445 in FIG. 4: the former can be delivered in a continuous manner and can change per clock cycle while the latter is stored in the mask register 440 and remains the same for each test pattern. The decompressing circuitry 710 comprises a decompressing unit 730 and a hold register 740. The decompressing unit 730 is configured to decompress the compressed mask signal 735. The decompressing unit 730 can use various decompression schemes such as a linear-decompression-based scheme (using a linear feedback shift register, embedded deterministic test (EDT), et al.) or a broadcast-scan-based scheme (broadcast scan, Illinois scan, et al.). The hold register 740 is configured to keep outputs of the decompressing unit 730 from changing for some clock cycles based on a hold signal 745. At every shift cycle, a new control bit of the hold signal 745 determines whether the hold register 740 should be reloaded with the current bits outputted from the decompressing unit 730. The hold signal 745 can be generated based on the distribution of X bits in the test response. The holding facilitates the encoding process that produces the compressed mask signal 735 because the number of bits to be encoded is significantly reduced. The encoding efficiency can go beyond the value of 1.00. The increased encoding efficiency can lead to a reduced control data volume.

The gating circuitry 750 is configured to gate compressed or uncompressed test response bits 765 based on the gating control signal outputted from the decompressing circuitry 710. The gating circuitry 750 comprises AND gates 760 that perform the gating operation. While FIG. 7 shows two test response channels, a person of ordinary skill in the art would appreciate that the circuit can be modified to have one or more than two test response channels.

Figure 8:
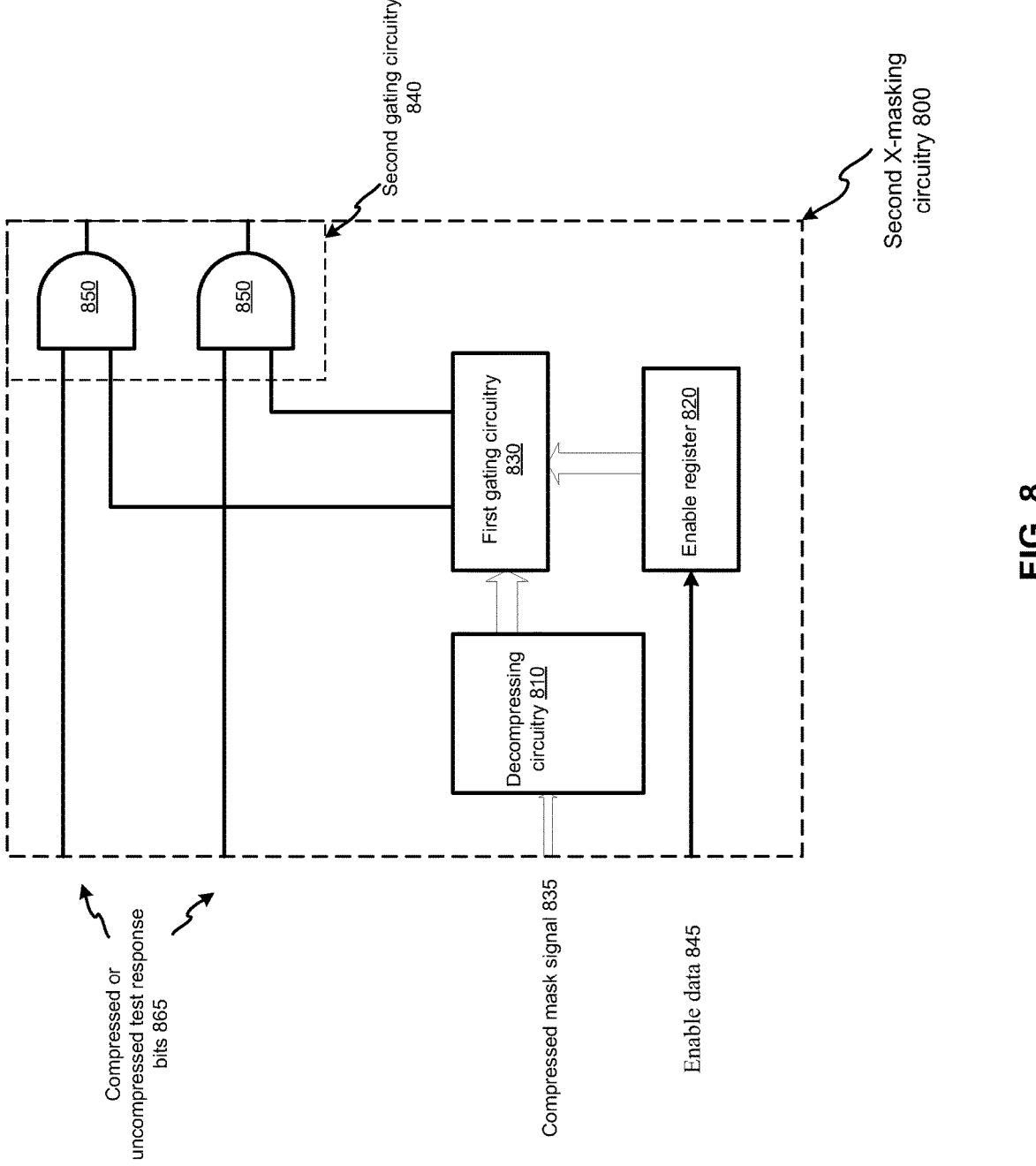
FIG. 8 illustrates another example of second X-masking circuitry which can be used to implement the second X-masking circuitry 232 in FIGS. 2 and 3 according to various embodiments of the disclosed technology.

FIG. 8 illustrates another example of second X-masking circuitry 800 which can be used to implement the second X-masking circuitry 232 in FIG. 2 and the second X-masking circuitry 332 in FIG. 3 according to various embodiments of the disclosed technology. The second X-masking circuitry 800 comprises decompressing circuitry 810, an enable register 820, first gating circuitry 830, and second gating circuitry 840. The decompressing circuitry 810 is configured to generate a gating control signal from a compressed mask signal 835 (second masking information). The enable register 820 is configured to store enable data 845 and supply it to the first gating circuitry 830. The enable register 820 can update its content once per pattern. The first gating circuitry 830 is configured to gate the gating control signal outputted from the decompressing circuitry 810 based on the gating control enabling data stored in the enable register 820. The second gating circuitry 840 is configured to gate compressed or uncompressed test response bits 865 based on an enabled gating control signal outputted from the first gating circuitry 830.

The decompressing circuitry 810 can comprise a conventional decompressor in a linear-decompression-based architecture or a broadcast-scan-based architecture. The first gating circuitry 830 may be formed by OR gates. The second gating circuitry 840 comprises AND gates 850. While FIG. 8 shows two test response channels, a person of ordinary skill in the art would appreciate that the circuit can be modified to have one or more than two test response channels.

The combination of the enable register 820 and the first gating circuitry 830 can allow one or more test response channels that do not contain X bits to pass through the second gating circuitry 840 no matter what bits of the gating control signal from the decompressing circuitry 810 are. As a result, the burden of encoding the gating control signal to generate the compressed mask signal 835 can be reduced. This, in turn, can lead to a reduction of control data volume, similar to the function of the hold register 740 in FIG. 7. The two control data reduction methods can be used together to achieve a better result by adding a hold register in the decompressing circuitry 810 as in FIG. 7.

Figure 9:
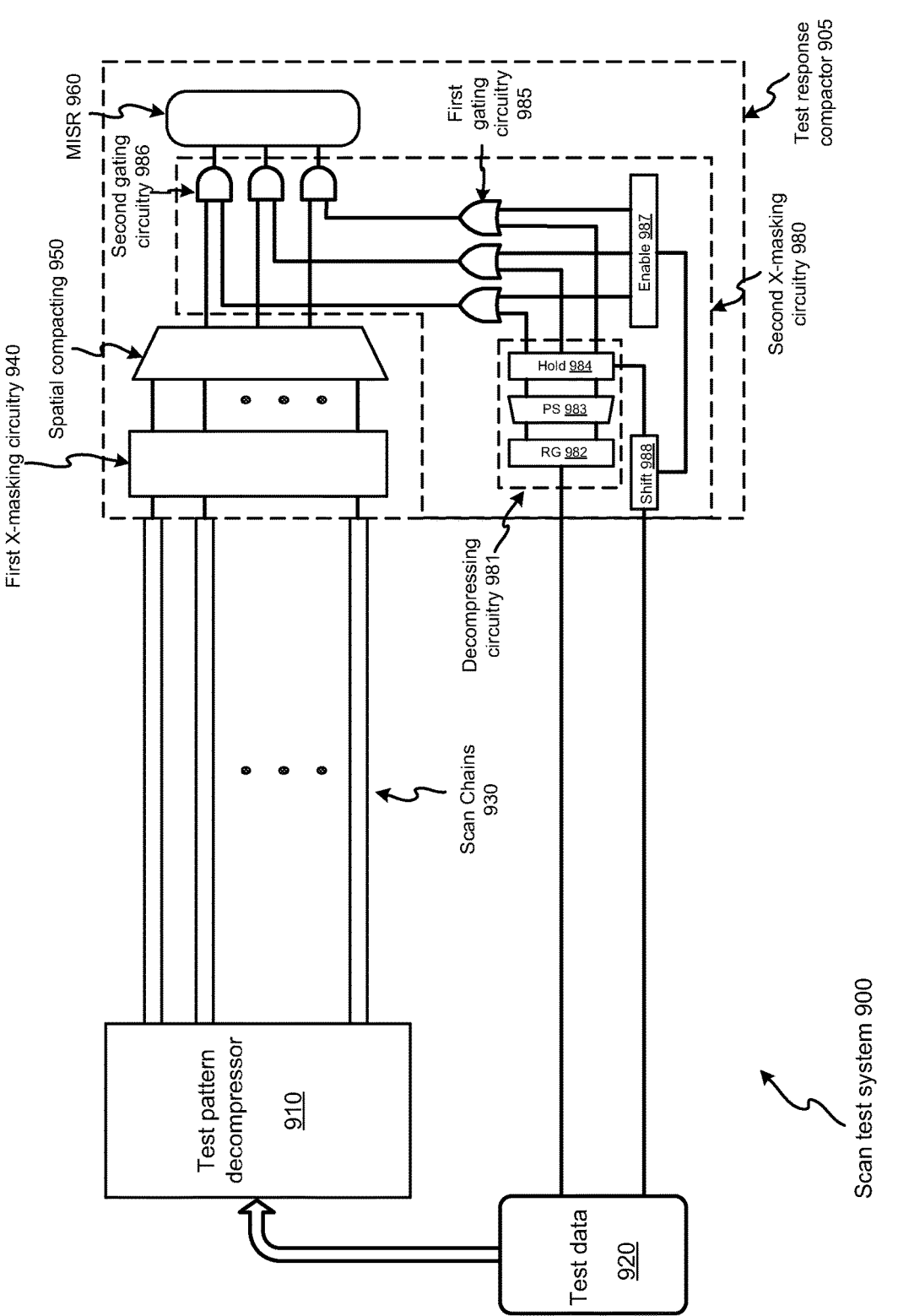
FIG. 9 illustrates still another example of a scan test system according to various embodiments of the disclosed technology.

FIG. 9 illustrates an example of a scan test system 900 according to various embodiments of the disclosed technology. The scan test system 900 comprises a test pattern decompressor 910, scan chains 930, a test response compactor 905, and a test data source 920. The test data source 920 can supply compressed test patterns to the test pattern decompressor 910 and the test control data to the test response compactor 905. The test pattern decompressor 910 can be an EDT decompressor. The test response compactor 905 comprise first X-masking circuitry 940, spatial test response compacting circuitry 950, second X-masking circuitry 980, and a multiple input signature register 960. The first X-masking circuitry 940 is configured to mask, based on first masking information, some of X bits in the test responses. The first X-masking circuitry 940 can be implemented using the first X-masking circuitry 400 in FIG. 4. The spatial test response compacting circuitry 950 is configured to compact the test response that has been processed by the first X-masking circuitry 940. The spatial test response compacting circuitry 950 can be implemented using an XOR network. The second X-masking circuitry 980 is configured to mask, based on second masking information, rest of the X bits in the compacted test responses. The multiple input signature register 960 is configured to compact the X-free compacted test response into a signature.

FIG. 9 also illustrates a detailed block diagram of the second X-masking circuitry 980. The second X-masking circuitry 980 comprises decompressing circuitry 981, a shift register 988, an enable register 987, first gating circuitry 985, and second gating circuitry 986. The decompressing circuitry 981, configured to decompress a compressed mask signal into a gating control signal, comprises a ring generator 982, a phase shifter 983, and a hold register 984. The ring generator 982 and the phase shifter 983 together form a conventional EDT decompressor. The hold register 984 is configured to keep outputs of the decompressing circuitry 981 from changing for some clock cycles based on a hold signal. Due to the existence of the hold register, the decompressing circuitry 981 can be referred to as an isometric decompressor. The enable register 987 is configured to store enabling data. The first gating circuitry 985 is configured to gate the gating control signal outputted from the decompressing circuitry 981 based on the gating control enabling data to generate an enabled gating control signal. The shift register 988 is configured to receive the hold signal and the enable signal from the test data source 920 and supply them to the hold register 984 and the enable register 987, respectively. The enable register 987 can update its content once per test pattern. Each bit of the hold signal determines whether the hold register 984 should be reloaded with the current outputs of the phase shifter 983. The second gating circuitry 986 is configured to gate outputs of the spatial test response compacting circuitry 950 based on the enabled gating control signal.

The compressed mask signal used by the decompressing circuitry 981 may be obtained as follows. Test responses processed by the first X-masking circuitry 940 can be represented by a 2-dimensional array: its number of rows equals the number of outputs, while the number of columns matches the response length (or alternatively the size of the longest scan chain). Every entry to the array equals D, X, or don't care, where D and X represent errors and unknown states, respectively. They become the subject of encoding in such a way that the resultant values of 0 are used to block (suppress) Xs, whereas the values of 1 allow Ds to reach the multiple input signature register 960. Data are processed individually for every test response.

As a first step, all X-free output channels are determined and the corresponding bits of the enable register are asserted. Rows corresponding to the X-free outputs are deleted from the response array. All faults that propagate to such outputs are declared detected. For every fault whose status remains undecided, its weight w is determined, which is the inverse of its observation site count c, that is w=1/c. This weight is linked with all observation sites of the fault in the output channels. As a result, a D-site receives a weight obtained by summing up all individual weights of faults seen at this particular site. Clearly, all X-entries of the array are assigned a 0-weight, whereas don't care sites receives a small non-zero weight.

The next step puts all non-zero observation sites on a list L that is sorted by the sites' weights in a descending order. Let M be a set of all sites whose masking signals need to be encoded. Initially, M contains all X-sites of a given test response. Now, the following process iterates. The first item can be removed from list L and be added to set M. Next, beginning with the clock cycle 0, it may be tried to encode the masking signals associated with members of M, but only if a particular site needs to create a new update of the hold register. It applies to two scenarios: (1) there is no update of the hold register yet for a given output channel, or (2) there is an earlier update of the hold register that forces an opposite value to the one that needs to be encoded at a particular clock cycle. Note that it is not attempted to encode anything provided an earlier update of the hold register forces the same value as that of current observation site. As can be seen, following the principles of the isometric compression, it can be tried to encode only X-sites and D-sites aligned with the reloads of the hold register. If a newly added D-site cannot be encoded, it is removed from M and the process continues. It is worth noting that with a multiple-detects option enabled, an error corresponding to a given fault may show up in several responses, and thus a likelihood of a coverage drop due to the X-masking performed by the second X-masking circuitry 980 is extremely low. Finally, in a very unlikely event of having set M populated exclusively by X-sites, one needs to redesign the first X-masking circuitry 940 by, for example, increasing the number of its outputs.

Figure 10:
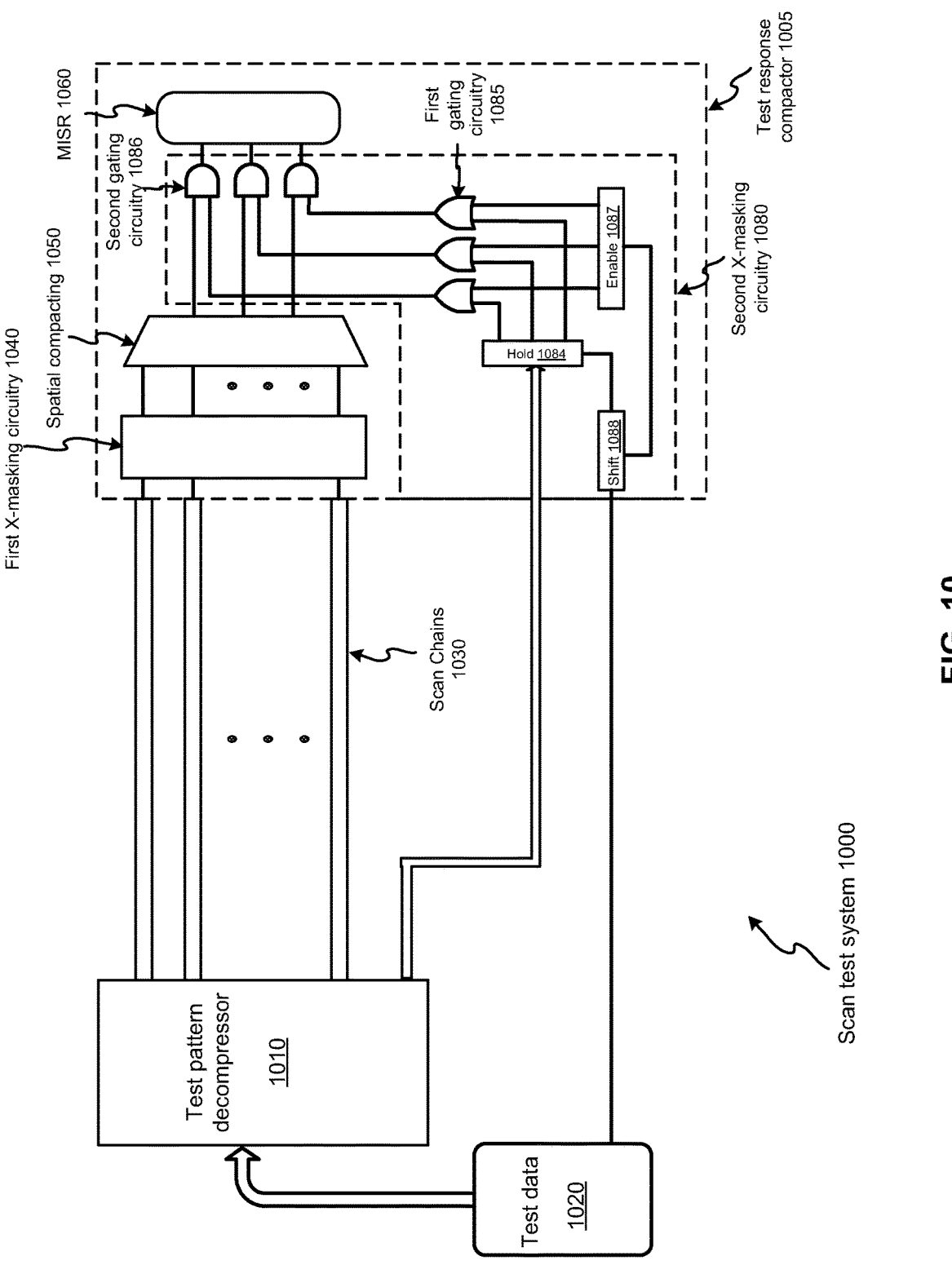
FIG. 10 illustrates still another example of a scan test system according to various embodiments of the disclosed technology.

FIG. 10 illustrates an example of a scan test system 1000 according to various embodiments of the disclosed technology. Like the scan test system 900 in FIG. 9, the scan test system 1000 comprises a test pattern decompressor 1010, scan chains 1030, a test response compactor 1005, and a test data source 1020. Also like the test response compactor 905 in FIG. 9, the test response compactor 1005 comprises first X-masking circuitry 1040, spatial test response compacting circuitry 1050, second X-masking circuitry 1080, and a multiple input signature register 1060. While comprising a shift register 1088, an enable register 1087, first gating circuitry 1085, and second gating circuitry 1086, similar to the second X-masking circuitry 980, the second X-masking circuitry 1080 does not comprise decompressing circuitry like the decompressing circuitry 981. In its place is a hold register 1084 corresponding to the hold register 984. The test pattern decompressor 1010 takes over the function of the ring generator 982 and the phase shifter 983.

It is observed that only a tiny fraction of seed variables injected through a single EDT channel is often needed to encode the gating control signal for the second X-masking circuitry 1080. Thus a separate isometric decompressor may not be needed. However, the scan test system 1000 may not be acceptable in certain situations due to its reduced degree of modularity. The encoding process of masking data for test pattern p can be tightly blended into the encoding process of test pattern p+1. Hence, one may not be able to easily reorder test patterns, if desired, for example, to run an adaptive form of testing.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
   scan chains comprising scan cells, the scan chains configured to shift in test patterns, apply the test patterns to the circuit, capture test responses of the circuit, and shift out the test responses;
   a decompressor configured to decompress compressed test patterns into the test patterns; and
   a test response compactor configured to compact the test responses, the test response compactor comprising:
   first X-masking circuitry configured to mask, based on first masking information, some of X bits in the test responses, the first masking information remaining the same while a test response for each of the test patterns is being shifted out, the first masking information being different for at least two of the test patterns, wherein the first X-masking circuitry operates in a per test pattern mode; and
   second X-masking circuitry configured to mask, based on second masking information, rest of the X bits in the test responses, wherein the second X-masking circuitry operates in a per clock cycle mode and comprises
   decompressing circuitry configured to generate a gating control signal from a compressed mask signal, the decompressing circuitry comprising a hold register configured to keep outputs of the decompressing circuitry from changing for some clock cycles based on a hold signal, and
   gating circuitry configured to gate signals at inputs of the gating circuitry based on the outputs of the decompressing circuitry.

2. The circuit recited in claim 1, wherein the first X-masking circuitry is configured to block outputs from some of the scan chains based on the first masking information.

3. The circuit recited in claim 1, wherein the test response compactor further comprises:
   spatial test response compacting circuitry with inputs coupled to outputs of the first X-masking circuitry.

4. The circuit recited in claim 1, wherein the test response compactor further comprises:
   a multiple input signature register with inputs coupled to outputs of the second X-masking circuitry or sticky-bits circuitry with inputs coupled to outputs of the second X-masking circuitry.

5. The circuit recited in claim 1, wherein the second X-masking circuitry further comprises:
   an enable register configured to store enable data; and another gating circuitry configured to generate an enabled gating control signal by gating the gating control signal based on the enable data,
   wherein the gating circuitry configured to gate signals at inputs of the gating circuitry based on the enabled gating control signal.

6. The circuit recited in claim 5, wherein the decompressing circuitry further comprises a decompressing unit, the decompressing unit being a standalone device or a part of the decompressor.

7. The circuit recited in claim 1, wherein the decompressing circuitry comprises a decompressing unit, the decompressing unit being a standalone device or a part of the decompressor.

8. One or more non-transitory computer-readable media storing computer-executable instructions for causing a computer to perform a method, the method comprising:
   creating a circuit in a circuit design for testing a chip fabricated according to the circuit design, the circuit comprising:
   scan chains comprising scan cells, the scan chains configured to shift in test patterns, apply the test patterns to the circuit, capture test responses of the circuit, and shift out the test responses;
   a decompressor configured to decompress compressed test patterns into the test patterns; and
   a test response compactor configured to compact the test responses, the test response compactor comprising:
   first X-masking circuitry configured to mask, based on first masking information, some of X bits in the test responses, the first masking information remaining the same while a test response for each of the test patterns is being shifted out, the first masking information being different for at least two of the test patterns, wherein the first X-masking circuitry operates in a per test pattern mode; and
   second X-masking circuitry configured to mask, based on second masking information, rest of the X bits in the test responses, wherein the second X-masking circuitry operates in a per clock cycle mode and comprises
   decompressing circuitry configured to generate a gating control signal from a compressed mask signal, the decompressing circuitry comprising a hold register configured to keep outputs of the decompressing circuitry from changing for some clock cycles based on a hold signal, and
   gating circuitry configured to gate signals at inputs of the gating circuitry based on the outputs of the decompressing circuitry.

9. The one or more non-transitory computer-readable media recited in claim 8, wherein the first X-masking circuitry is configured to block outputs from some of the scan chains based on the first masking information.

10. The one or more non-transitory computer-readable media recited in claim 8, wherein the test response compactor further comprises:
   spatial test response compacting circuitry with inputs coupled to outputs of the first X-masking circuitry.

11. The one or more non-transitory computer-readable media recited in claim 8, wherein the test response compactor further comprises:
   a multiple input signature register with inputs coupled to outputs of the second X-masking circuitry or sticky-bits circuitry with inputs coupled to outputs of the second X-masking circuitry.

12. The one or more non-transitory computer-readable media recited in claim 8, wherein the second X-masking circuitry further comprises:

an enable register configured to store enable data; and another gating circuitry configured to generate an enabled gating control signal by gating the gating control signal based on the enable data, wherein the gating circuitry configured to gate signals at inputs of the gating circuitry based on the enabled gating control signal.

13. The one or more non-transitory computer-readable media recited in claim 12, wherein the decompressing circuitry further comprises a decompressing unit, the decompressing unit being a standalone device or a part of the decompressor.

14. The one or more non-transitory computer-readable media recited in claim 8, wherein the decompressing circuitry comprises a decompressing unit, the decompressing unit being a standalone device or a part of the decompressor.

* * * * *